US009251890B1

(12) United States Patent
Agarwal et al.

(10) Patent No.: US 9,251,890 B1
(45) Date of Patent: Feb. 2, 2016

(54) BIAS TEMPERATURE INSTABILITY STATE DETECTION AND CORRECTION

(71) Applicant: GLOBALFOUNDRIES INC., Grand Cayman (KY)

(72) Inventors: Navin Agarwal, Kolkata (IN); Igor Arsovski, Williston, VT (US); Venkatraghavan Bringivijayaraghavan, Cheyyar (IN); Krishnan S. Rengarajan, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/577,113

(22) Filed: Dec. 19, 2014

(51) Int. Cl.
| | |
|---|---|
| *G11C 11/00* | (2006.01) |
| *G11C 11/419* | (2006.01) |
| *G11C 7/10* | (2006.01) |
| *G11C 7/04* | (2006.01) |
| *G11C 11/4096* | (2006.01) |
| *G11C 7/22* | (2006.01) |

(52) U.S. Cl.
CPC .............. *G11C 11/419* (2013.01); *G11C 7/04* (2013.01); *G11C 7/109* (2013.01); *G11C 7/1051* (2013.01); *G11C 7/22* (2013.01); *G11C 11/4096* (2013.01)

(58) Field of Classification Search
CPC ........ G11C 7/04; G11C 7/109; G11C 7/1051; G11C 7/22; G11C 7/1072; G11C 11/4096
USPC ............... 365/154, 156, 191, 189.07, 189.14, 365/189.16, 233.1, 233.11
See application file for complete search history.

(56) References Cited

U.S. PATENT DOCUMENTS

| | | | |
|---|---|---|---|
| 5,390,149 A * | 2/1995 | Vogley ................. | G11C 7/1006 365/189.04 |
| 6,879,177 B1 | 4/2005 | Bolam et al. | |
| 7,009,905 B2 | 3/2006 | Aipperspach et al. | |
| 7,183,791 B2 | 2/2007 | Walker et al. | |
| 7,504,847 B2 | 3/2009 | Goodnow et al. | |
| 7,793,181 B2 | 9/2010 | Chandra et al. | |
| 7,821,330 B2 | 10/2010 | Wang et al. | |
| 8,018,260 B2 | 9/2011 | Papageorgiou et al. | |
| 8,081,003 B2 | 12/2011 | Pacha et al. | |
| 8,229,683 B2 | 7/2012 | Gebara et al. | |
| 8,432,868 B2 * | 4/2013 | Feng ..................... | H04W 36/18 370/329 |
| 8,519,767 B2 | 8/2013 | Booth et al. | |
| 8,552,793 B2 | 10/2013 | Shimogawa et al. | |
| 2005/0134360 A1 | 6/2005 | Aipperspach et al. | |
| 2006/0049886 A1 | 3/2006 | Agostinelli, Jr. et al. | |
| 2008/0036487 A1 | 2/2008 | Bradley et al. | |
| 2010/0271092 A1 * | 10/2010 | Zerbe .................. | G06F 13/4243 327/161 |

(Continued)

OTHER PUBLICATIONS

Dick et al., "Mitigating NBTI Degradation", provided by evaluator in Main Idea of Disclosure dated Jan. 24, 2014, <http://ziyang.eecs.umich.edu/projects/nbti/>.

(Continued)

*Primary Examiner* — Gene Auduong
(74) *Attorney, Agent, or Firm* — Thompson Hine LLP

(57) ABSTRACT

A memory device with an age-detect-and-correct (ADAC) circuit that detects skew caused by bias temperature instability fatigue (that is, bias temperature instability stress accumulated over time), and counters skew by selectively adjusting the proportion (measured temporally) of active state operation to idle state operation. Also, a memory burn-in device using a similar ADAC circuit.

20 Claims, 8 Drawing Sheets

(56) References Cited

U.S. PATENT DOCUMENTS

| | | |
|---|---|---|
| 2010/0321079 A1 | 12/2010 | Ishii et al. |
| 2011/0235459 A1* | 9/2011 | Ware .................. G11C 7/04 365/233.11 |
| 2012/0062257 A1 | 3/2012 | Baumann et al. |
| 2013/0002327 A1 | 1/2013 | Jain |
| 2014/0002160 A1 | 1/2014 | Priel et al. |
| 2015/0089164 A1* | 3/2015 | Ware .................. G11C 5/02 711/149 |

OTHER PUBLICATIONS

Ghosh et al., "On-chip Negative Bias Temperature Instability Sensor using Slew Rate Monitoring Circuitry", University of Utah, Salt Lake City, UT 84112, provided in post disclosure comments dated Jan. 24, 2013.

Kumar et al., "Adaptive Techniques for Overcoming Performance Degradation due to Aging in Digital Circuits", Design Automation Conference, 2009, ASP-DAC 2009, Asia and South Pacific, Yokohama, Jan. 19-22, 2009, 978-1-4244-2749-9/09, © 2009 IEEE, pp. 284-289.

* cited by examiner

BIAS TEMPERATURE INSTABILITY STATE DETECTION AND CORRECTION

BACKGROUND

The present invention relates generally to the field of bias temperature instability (BTI) in the circuits of an integrated circuit, and, more particularly to hardware and techniques minimizing adverse effects that can be caused by BTI.

BTI stress is a known phenomenon. Generally speaking: (i) BTI degrades the performance of the semiconductor material in transistors in a way that depends on the voltages (for example, high, low) and the source, gate and drain terminals; and (ii) BTI degradation is asymptotic in nature so that the longer a transistor is maintained in a high BTI stress voltage state, the less marginal BTI degradation will occur. It is also known that if certain electrically-proximate circuit components have different levels of BTI degradation, then this can cause poor performance, or even electrical malfunction. BTI degradation (and/or uneven distribution of BTI degradation among circuit components) has been recognized as a potential problem for nano-scale PFET (NBTI) and NFET (PBTI) transistors. One category of techniques for attempting to prevent adverse effects caused by BTI is to: (i) try to estimate (by analytical, rather than empirical, techniques) how much BTI degradation the various circuit components of a (generally large scale) circuitry set have undergone; and (ii) adjust duty cycles and/or otherwise "burn in" the circuitry with signals designed to even out the level of BTI degradation as among the various components of the circuitry set.

BTI has the following additional known characteristics: (i) a NFET (negative channel field effect transistor) device exhibits an increase in non-mobile negative charge during symmetric (source=drain) stress, and this shift results in larger magnitude threshold voltages over time; (ii) PFET (positive channel field effect transistor) device exhibits an increase in non-mobile positive charge during symmetric (source=drain) stress, and this shift results in larger magnitude threshold voltages over time; and (iii) for a matched PFET pair, NBTI (negative-bias temperature instability) can introduce a mismatch shift in the following ways: (a) when the gate biases or the equivalent time of the gate biases are not equal in the two PFET devices, this inequality will induce a systematic mismatch in Vt (threshold voltage), (b) process variations across the chip, such as tox, will cause systematic mismatch shifts between widely spaced devices, and (c) for closely spaced devices with equal gate biases, NBTI will induce a random mismatch shift.

Concepts related to forward and reverse operation will now be discussed. There are two (2) states for a memory circuit: (i) forward state (also called an active state); and (ii) a reverse state (also called an idle state). An active state occurs when a clock input triggers the internal circuit chain elements to change from an idle state (reverse state) to the opposite state (forward state). At the end of memory access (as might be defined either by external clock itself by say, its falling edge, or by some internal timing circuit that will designate the end of the access) the memory circuits are returned to the idle state.

SUMMARY

According to an aspect of the present invention, a memory device includes a set of memory circuits configured to store data by selectively being operated in one of the two following states: idle state and active state. The memory device further includes a timing control module configured to selectively control the operational state of the set of memory circuits, with the timing control module including a root combinational logic location. The memory device further includes an age-detect-and-correct (ADAC) circuit, connected across the root combinational logic location and including a first set of transistor(s) and a second set of transistor(s). The ADAC circuit is configured to control the timing control module to arbitrate between the idle state and the active state based upon a difference in bias temperature instability fatigue as between the first set of transistor(s) and the second set of transistor(s).

According to a further aspect of the present invention, a memory burn-in device includes a set of memory circuits configured to store data by selectively being operated in one of the two following states: idle state and active state. The memory burn-in device further includes a timing control module configured to selectively control the operational state of the set of memory circuits during burn-in, with the timing control module including a root combinational logic location. The memory burn-in device further includes a skew detect circuit, connected across the root combinational logic location and including a first set of transistor(s) and a second set of transistor(s). The skew detect circuit is configured to control the timing control module to arbitrate between the idle state and the active state, during burn-in, based upon a difference in bias temperature instability fatigue as between the first set of transistor(s) and the second set of transistor(s).

According to a further aspect of the present invention, a method includes the following operations (not necessarily in the following order): (i) starting to perform burn-in operations using a memory burn-in device that includes a set of memory circuits and a skew detection circuit, with the memory burn-in operations including an idle state and an active state; (ii) detecting, by the skew detection circuit, which of the following two alternatives are applicable: (a) idle state needs to be skewed, or (b) active state needs to be skewed; (iii) on condition that idle mode needs to be skewed, then continuing burn-in operation without adjustment to an internal clock; and (iv) on condition that active state needs to be skewed, adjusting a pulse width of an internal clock to increase the amount of time that the memory circuits are in an active state.

DETAILED DESCRIPTION

Figure 1:
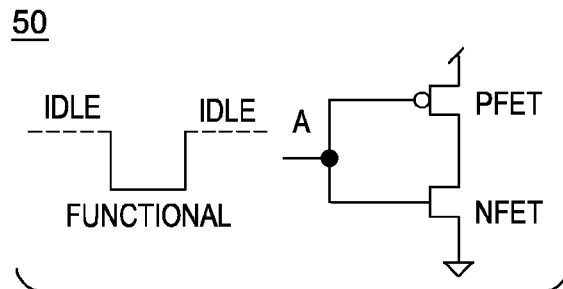
FIG. 1 is a combined circuit and timing diagram helpful for understanding various embodiments of the present invention.

Some embodiments of the present invention are directed to a memory device with an age-detect-and-correct (ADAC) circuit that detects skew caused by bias temperature instability fatigue (that is, bias temperature instability stress accumulated over time), and counters skew by selectively adjusting the proportion (measured temporally) of active state operation to idle state operation. Some embodiments of the present invention are directed to a memory burn-in device using a similar ADAC circuit (sometimes also referred to herein as a skew detection circuit).

Some embodiments of the present invention recognize that BTI degradation (also called BTI fatigue), for a given memory circuit, generally relates to how long it is held in the active state (or forward state) and how long it is held in the idle state (that is, the reverse state). Some embodiments of the present invention recognize that putting memory circuits in any one state will affect the circuit timing and timing margins, which can lead to unfavorable results. For example, if there is an internal margin that needs to be positive for correct operation, and if that internal margin degrades due to a stress on one of the paths as compared to the other path constituting the margin, then the function of the memory circuit will be in jeopardy. Some embodiments of the present invention further recognize that BTI stress occurs on all devices that are ON. If ON for long time, then this leads to increased BTI stress. If there is a balance, then the margin (that is, the delay difference) between any two (2) arbitrary paths doesn't degrade although each of the paths may degrade. However, if only one of the paths degrades more than the other (due to the relative balance between amount of forward operation and the amount of reverse operation) then the margin can degrade.

In this document, "skew" means the delay difference between two paths. In some embodiments of the present invention, by keeping a balanced forward/reverse operation the skew between pairs of paths, which are not designed to exhibit a delay difference, can be minimized so that delay difference between paths of the pair of paths remains minimal.

In order to help in understanding the various embodiments of the present invention, to be discussed in detail below, the BTI effect will now be discussed in some detail. Bias temperature instability (BTI) has become a reliability concern for nano-scale PFET transistors (subject to NBTI) and NFET transistors (subject to PBTI). NBTI (Negative Bias temperature instability) occurs under negative gate voltage (for example, Vgs=–VDD) and is measured as an increase in the magnitude of threshold voltage. PBTI affects PMOS (P-type metal-oxide-semiconductor) transistors and degrades the device drive current, circuit speed, noise margin, and the matching property. Similarly, NTBI affects NMOS (N-type metal-oxide-semiconductor) transistors with Vgs=VDD.

Techniques to mitigate the NBTI and PBTI degradation include VDD tuning and reducing the duty cycle. Some embodiments of the present invention control the duty factor of the gate voltage of critical devices in the circuit design. Some embodiments of the present invention put the integrated circuit (IC) device subject to BTI effect (that is, the "target IC device") in active mode during burn-in in order to reduce degradation of the target IC device during use by end users (that is, "field use").

As shown in diagram 50 of FIG. 1, under a first condition, WL (word line) driver has been activated (in this example, there is an activation probability of 1/16). Under the first condition: (i) during idle state operations, the NFET will be stressed by the BTI effect; and (ii) during functional state operations, the PFET will be stressed.

Figure 2:
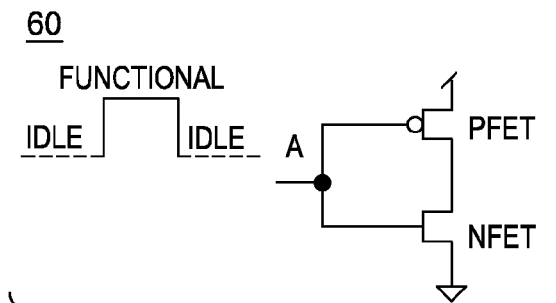
FIG. 2 is a combined circuit and timing diagram helpful for understanding various embodiments of the present invention.

As shown in diagram 60 of FIG. 2, under a second condition, WL driver has been activated (in this example, there is an activation probability of 1/16). Under the first condition: (i) during idle state operations, the PFET will be stressed by the BTI effect; and (ii) during functional state operations, the NFET will be stressed.

Figure 3:
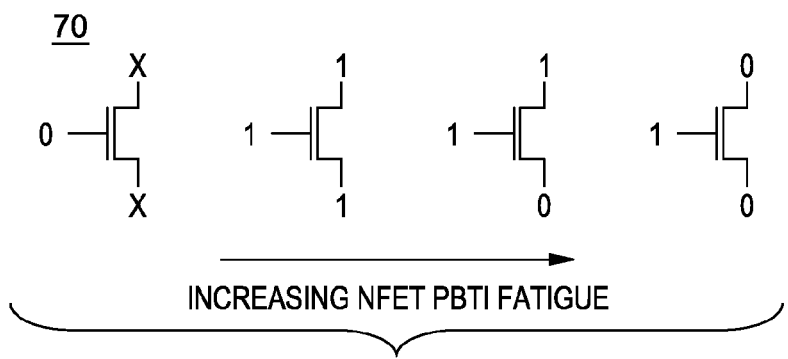
FIG. 3 is a circuit diagram helpful for understanding various embodiments of the present invention.
Figure 4:
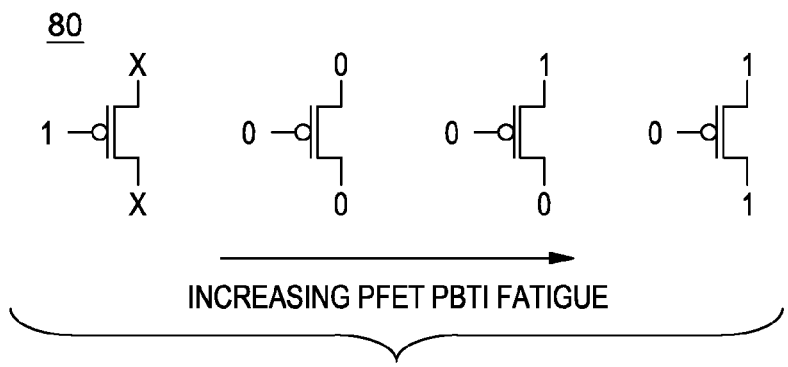
FIG. 4 is a circuit diagram helpful for understanding various embodiments of the present invention.

Analysis done for both DC (direct current) and AC (alternating current) stress for burn-in and real-life degradation has shown that target IC devices should not be stressed in a specific state. As shown in diagram 70 of FIG. 3, NFET PTBI fatigue (also called Vt shift) is greater for some NFET states than others. As shown in diagram 80 of FIG. 4, PTBI fatigue is also greater for some PFET states than others.

Some embodiments of the present invention may include one, or more, of the following features, characteristics and/or advantages: (i) good controllability at transistor level due to a relatively granular approach; (ii) reduced area overhead, performance penalty and/or complexity of circuit techniques; (iii) decreased stress on devices that get stressed during functional state relative to conventional techniques that use dummy activity during idle state operations; (iv) decreased power consumption relative to conventional techniques that use dummy activity during idle state operations; and/or (v) avoids voltage scaling with time/adaptively at the cost of increased power (leakage and dynamic power).

Figure 5:
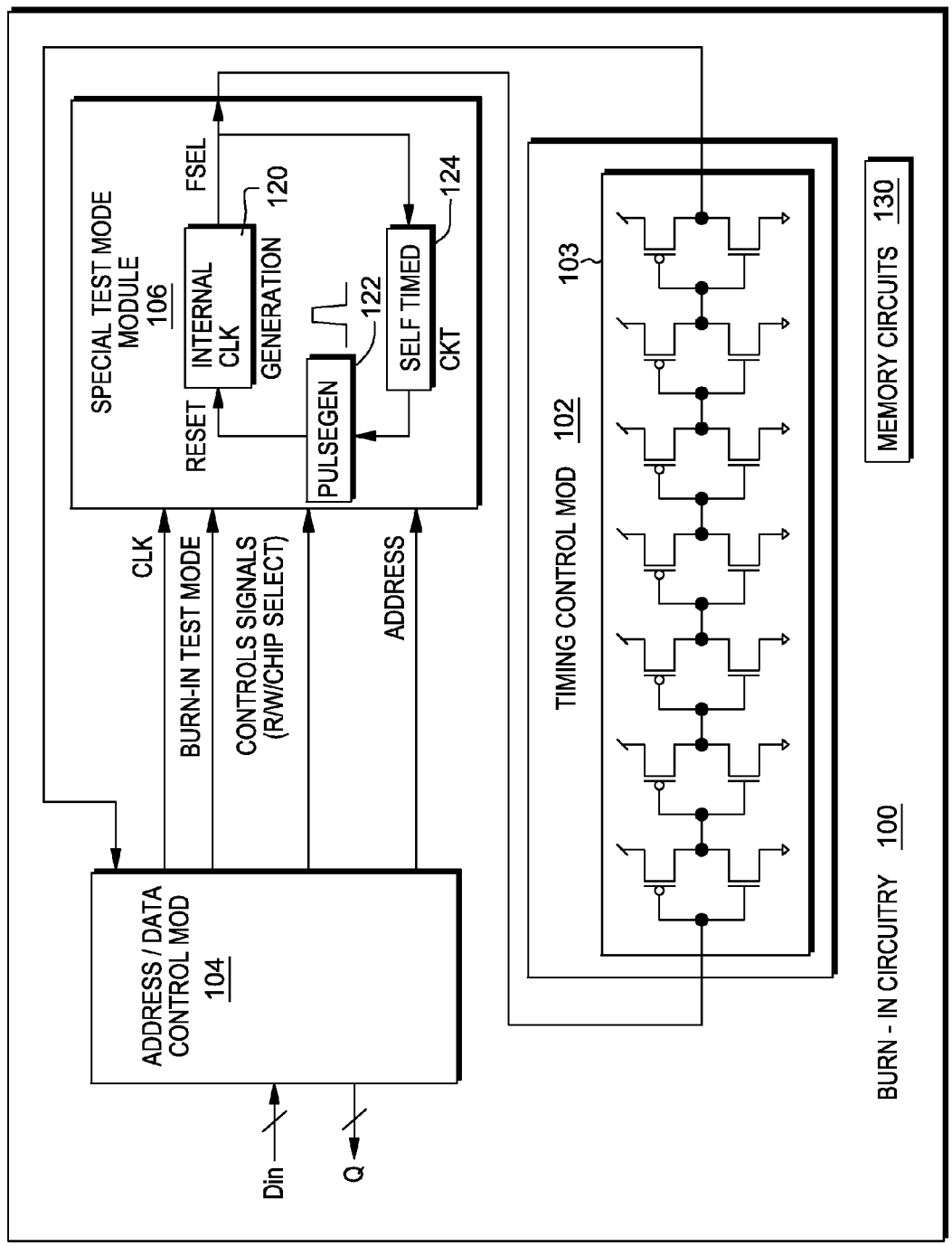
FIG. 5 is a block diagram of a first embodiment of a memory burn-in device according to the present invention.

Moving now to a discussion of some embodiments of the present invention, as shown in FIG. 5, burn-in circuitry 100 includes: timing control module ("mod") 102 (including inverter chain 103); address/data control mod 104; and special test mode mod 106. Special test mode mod 106 includes: internal clock generation sub-mod 120; pulse generation sub-mod 122; self-timed circuit sub-mod 124; and memory circuits 130. In burn-in circuitry 100, the target IC device is a memory device including, in relevant part, memory circuits 130. Address/data control mod 104 is similar to conventional address/data control mods used for burn-in, and will not be discussed in detail here.

During burn-in: (i) devices in the memory circuits 130 which are idle during burn-in will degrade drastically; and (ii) devices in memory circuits 130 which are active during burn-in will degrade during field of operation (FOP) because these active devices do not undergo much BTI stress during burn-in. Specifically, the devices in memory circuits 130 which are stressed are as follows: (i) PFETs in the condition shown in diagram 50 of FIG. 1; and (ii) NFETs in the condition in diagram 60 of FIG. 2.

In the technique used during burn-in with burn-in circuitry 100, all the critical devices undergo exponential degradation during burn-in and therefore give a consistent in field performance. Burn-in circuitry 100 uses a special test mode (implemented by special test mode mod 106). This special test mode puts the memory in the active state, as though an "operation" is in progress. The duration of being in active state versus the idle state is arbitrated directly from special test mode module 106 by selectively adjusting the clock duty cycle. In other embodiments of the present invention and as will be discussed below, the duration of being in active state versus the idle state is arbitrated through special adaptive circuits.

Figure 6:
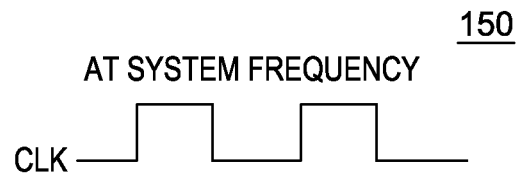
FIG. 6 is a signal timing diagram helpful in understanding various embodiments of the present invention.
Figure 7:
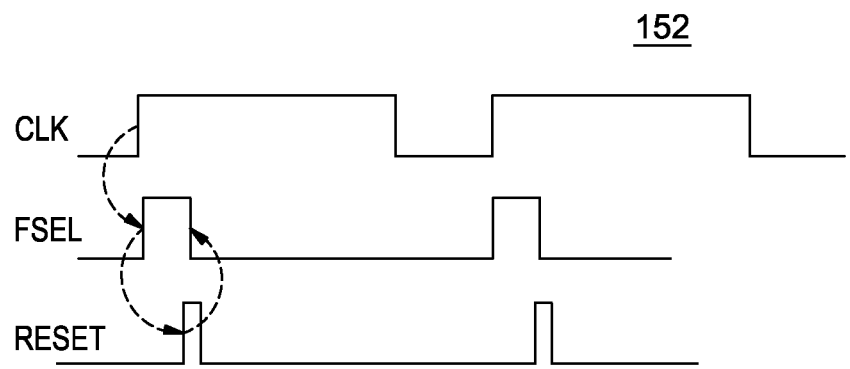
FIG. 7 is a signal timing diagram helpful in understanding various embodiments of the present invention.
Figure 8:
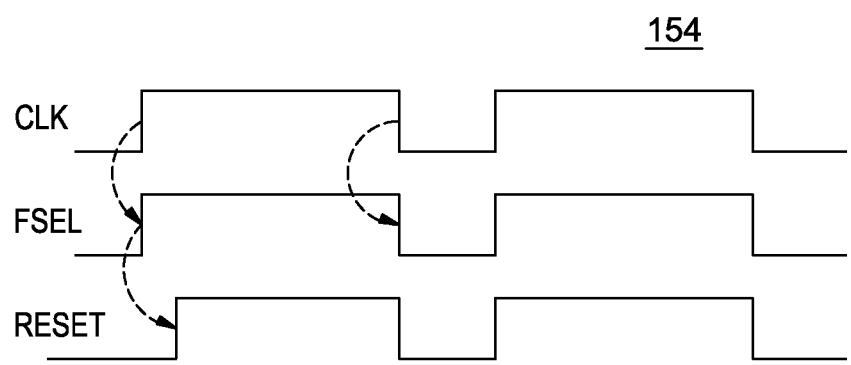
FIG. 8 is a signal timing diagram helpful in understanding various embodiments of the present invention.

As shown in diagram 150 of FIG. 6, the CLK signal has a "system frequency." Diagram 152 of FIG. 7 shows, for the sake of comparison, conventional circuit test mode techniques for memories that use a self-timing circuit. In the regular functional mode, the self-timing circuit will be triggered by the rising edge of the external clock input, and internally reset the circuit state back to the idle state after the intended operation (for example, read or write) is complete. Diagram 154 of FIG. 8 shows a test mode for the burn-in condition used with burn-in circuitry 100.

The test mode of diagram 154, implemented by special test mode mod 106, makes the memory functional (also referred to as "active") based upon the relatively long pulses of the external clock CLK. By comparing diagrams 152 and 154, it is shown that special mode mod 106 delays the falling edge of the internal clock signal FSEL so that the pulses of the internal clock FSEL are just as long in duration as the pulses of the external clock CLK. This is different than the conventional technique, shown in diagram 152, where the pulses of internal clock FSEL are much shorter than the pulses of the external clock CLK. Conventionally, the memory circuits are idle during the interval between the end of a pulse of the internal clock FSEL and the next rising edge of the internal and external clocks. However, special mode mod 106 lengthens each pulse of internal clock FSEL so that the memory circuits remain active, during burn-in in burn-in circuitry 100, for more time than they otherwise would. The memory circuits 130 of burn-in circuitry 100 will still have idle time, but this idle time is limited to the intervals where external clock CLK (and internal clock FSEL controlled by special mode mod 106) is between pulses.

In this embodiment of burn-in circuitry 100, internal clock FSEL is controlled to have pulses that are equal in duration to the pulses of external clock CLK. Alternatively, special test mode mod 106 could control internal clock FSEL so that: (i) its pulses are longer in duration than they conventionally would be, but shorter in duration than the pulses of external clock CLK; and/or (ii) longer in duration than the pulses of external clock CLK. However, the FSEL pulses are controlled by special mode mod 106, the objective is to make sure that devices of memory circuits 130 undergo at least roughly the same amount of BTI stress whether they happen to be stressed when the memory is active, or whether they get stressed when the memory is idle.

In this embodiment, active and idle time during burn-in is determined such that all the critical devices undergo the exponential degradation during burn-in, and, therefore, give a consistent infield performance. The addresses are cycled through during burn-in. The external clock duty cycle during burn-in is determined based on the above said criteria where all the critical devices will undergo the exponential degradation during burn-in.

During burn-in operation of burn-in circuitry 100, special test mode module 106 adjusts the FSEL and reset signals so that their trailing edges match the "relaxed clock frequency" of the CLK signal. This adjustment of the FSEL and reset signals serves to arbitrate the duration of being in active state versus the idle state so that stresses can be made approximately equal as between: (i) memory circuit components of memory circuits 130 that undergo BTI stress in the active state; and (ii) memory circuit components of memory circuits 130 that undergo BTI stress in the idle state.

Figure 9:
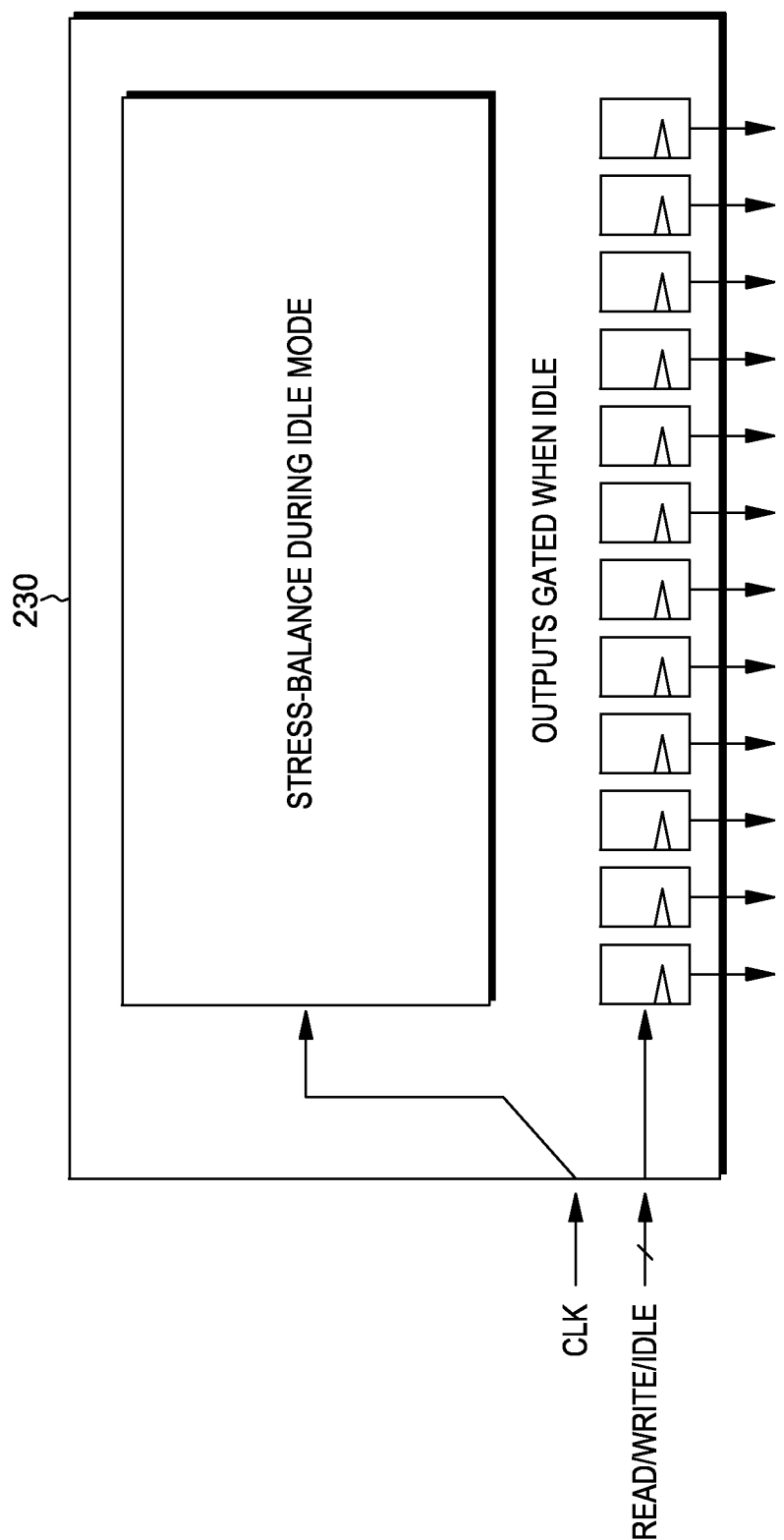
FIG. 9 is a block diagram of a first embodiment of a memory device according to the present invention.
Figure 10:
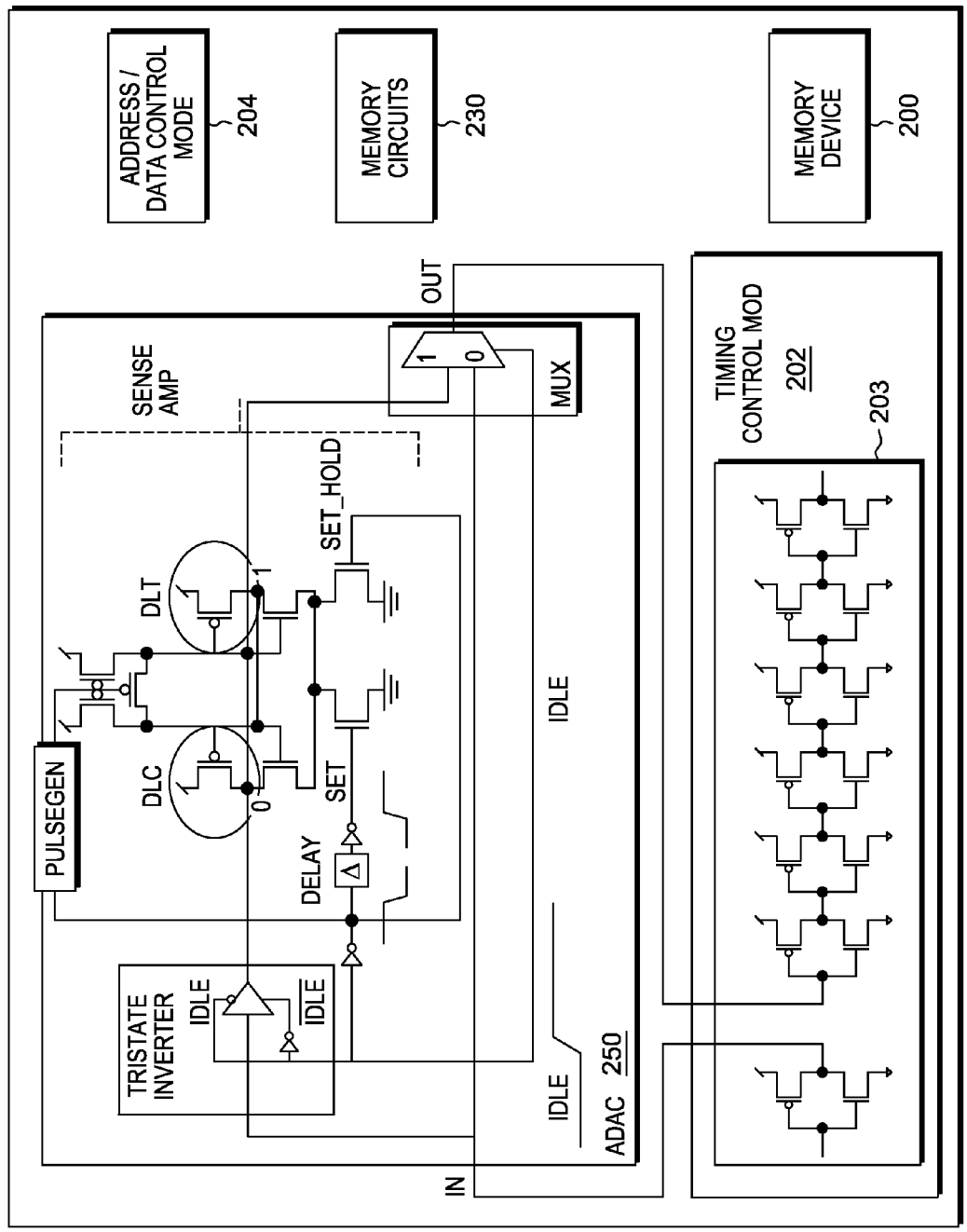
FIG. 10 is another block diagram of the first embodiment memory device.

As shown in FIGS. 9 and 10, memory device 200 includes: timing control mod 202; address/data control mod 204; memory circuits 230; and Age-Detect-And-Correct circuit (ADAC) 250. Memory device 200 has already been through burn-in and is now in field use to store data. Some operations of memory device 200 will be discussed in the following paragraphs.

As shown in FIGS. 9 and 10, ADAC 250 controls the operation of memory circuits 230 so that when memory circuits 230 are idle: (i) the outputs of memory circuits 230 are latched and gated (remain unchanged); and (ii) the internal circuits of memory circuits 230 receive balanced aging as between PFETs and NFETs (PFETS and NFETs not separately shown in the Figures).

As shown in FIG. 10, ADAC 250 is electrically connected at root combinational logic locations within inverter chain 203 of timing control mod 202. When memory circuits 230 are active, then ADAC 250 acts like a buffer. When memory circuits 230 are idle, then ADAC 250: (i) detects the direction of the path aging; and (ii) controls the critical combinational logic into an appropriate state to heal the path aging. In various embodiments of the present invention that include critical combinational logic, the critical combinational logic may be located: (i) as part of timing control mod 202; (ii) part of address/data control mod 204; (iii) part of memory circuits 230; and/or (iv) other locations. In a given embodiment, the location of this circuitry should be chosen by the system designer based on circumstances, such as: (a) the criticality (if the margin is high by design then not critical) race margin in question; and/or (b) recognizing the amount of tradeoff versus area or performance of the memory circuits.

In order to detect the direction of the path aging, ADAC 250 uses a sense amplifier (see "Sense Amp" in FIG. 10) to detect the skew in the path. The sense amplifier is a sort of proxy for downstream logic of timing control mod 202 because the sense amplifier of ADAC 250 can be expected to develop a skew similar to any skew that is developing in downstream logic of timing control mod 202 during operations of memory device 200. As explained, above, this skew is caused by imbalanced occurrence of BTI stress.

The operation of the sense amplifier ("sense amp") will now be discussed in more detail. The sense amp amplifies its input differential signal when put in the amplifying state (that is, the precharge/equalization is released after preconditioning signal DLT and signal DLC to same levels) and SET is made ON. The nominally matched pairs of NFET and PFET transistors in the amplifier will be mismatched due to stress previously accumulated from operation time spent in a driven state (that is, active state). Hence when not driven, there will be a propensity to settle in a preferred state dictated by the mismatch in the transistors when there is sufficient mismatch developed in the gain transistors (that is, the matched pair) to resolve the sense amp in one preferred direction when SET turns ON. As shown in FIG. 10, part of the delay circuitry of ADAC 250 is shared with a pulse generation circuit. The pulse generation circuit generates a pulse to equalize signals DLT/DLC before turning on the sense amp using SET.

As shown in FIG. 10, ADAC 250 also includes a tri-state inverter. The role of the tri-state inverter is to do as follows: the tri-state inverter drives the sense amp input to one state, as a function of its input state when the memory is accessed. So if the memory is accessed a lot more than it is idle, then the input "IN" will set the state of the sense amp devices thus causing more stress to particular transistors in the pair. Thus, the cumulative activity of the memory is stored as stress in the devices, which is mismatch for the sense amplifier. This mismatch makes the sense amp choose a preferred state when put into the detect state (in other words, tri-state inverter won't drive, but, rather, just float its output) during idle state.

Figure 11:
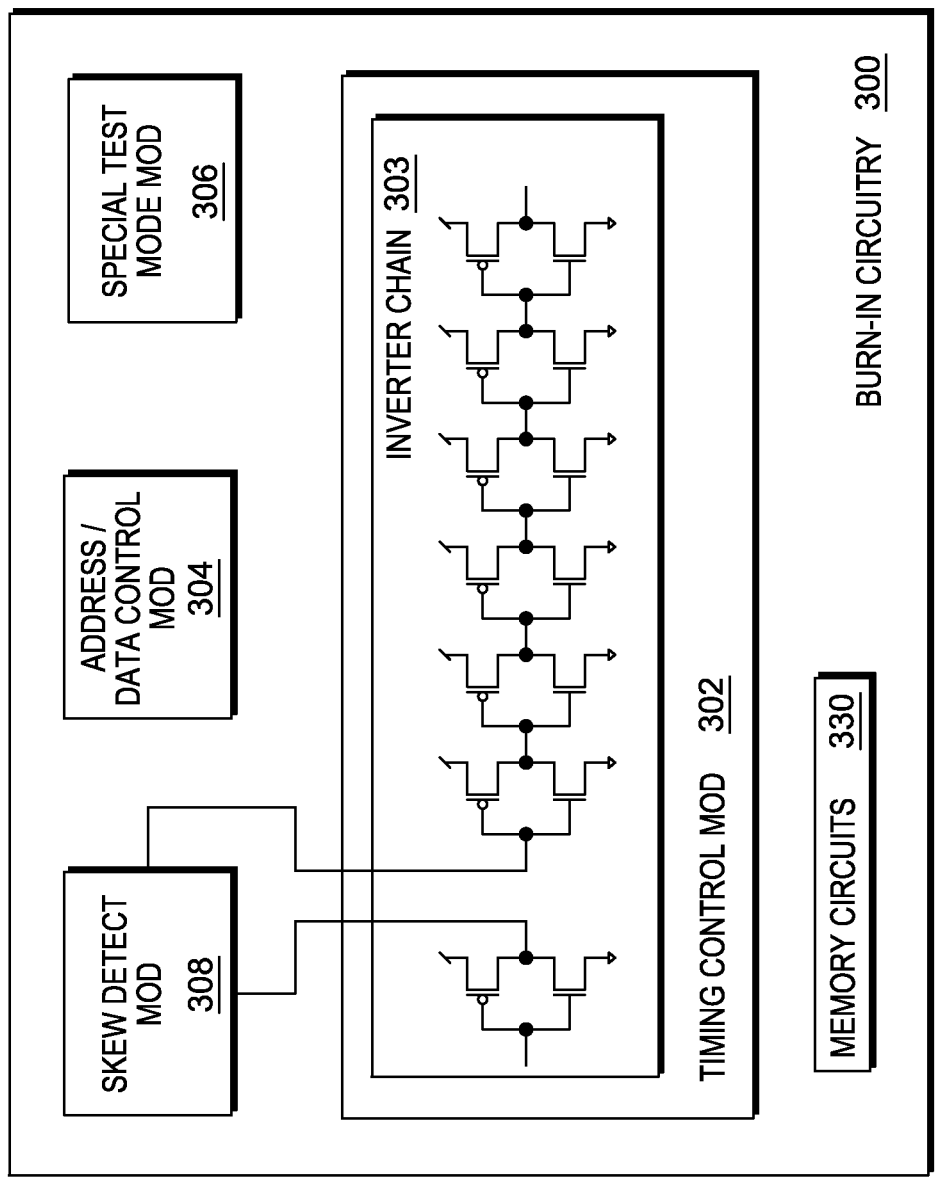
FIG. 11 is a block diagram of a second embodiment of a memory burn-in device according to the present invention.
Figure 12:
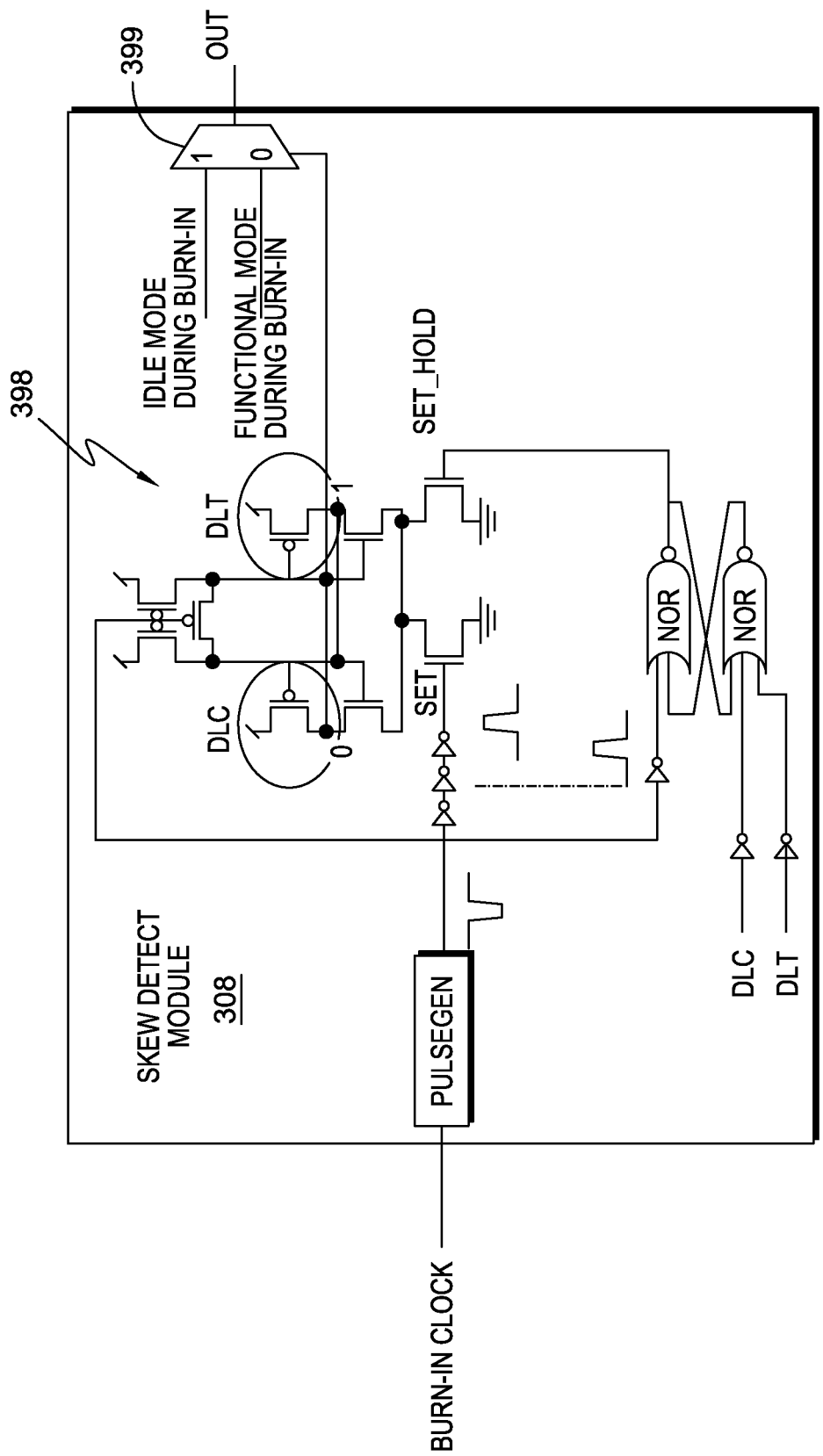
FIG. 12 is a block diagram of a portion of the second embodiment memory burn-device.

As shown in FIGS. 11 and 12, burn-in circuitry 300 includes: timing control module 302 (including inverter chain 303); address/data control mod 304; special test mode mod 306; skew detect mod 308; and memory circuits 330. Address/data control mod 304 is similar to address/control mod 104 (see FIG. 5), discussed above in connection with burn-in circuitry 100. Special test mode mod 306 is similar to special test mode mod 106 (see FIG. 10) discussed above in connection with burn-in circuitry 100. Skew detect mod 308 is somewhat similar to ADAC 250 discussed above in connection with memory device 250 (see FIG. 10), but it also has some difference, which can be seen by comparing ADAC 250 in FIG. 10 with the detailed view of skew detect mod 308 shown in FIG. 12.

In burn-in circuitry 300, skew detect mod 308 controls the burn-in operations of special test mode mod 306. More specifically, skew detect mod 308 is an adaptive circuit that arbitrates the relative durations of the active state of the memory circuits and the idle state of the memory circuits.

Figure 13:
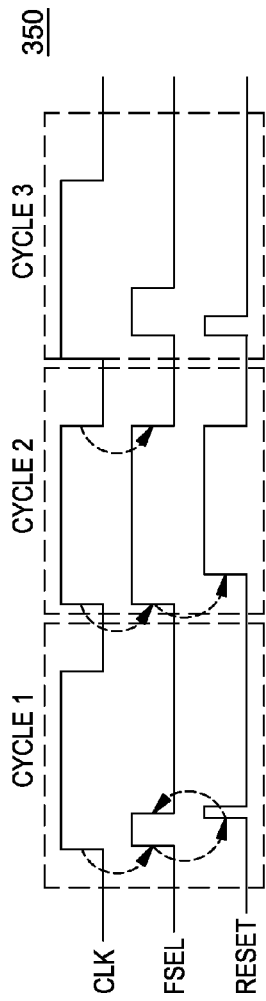
FIG. 13 is a signal timing diagram helpful in understanding various embodiments of the present invention.

As shown in timing diagram 350 of FIG. 13, during Cycle 1, skew detect mod 308 determines idle mode of operation during burn-in. More specifically, skew detect mod 308 determines idle mode through component 399 (see FIG. 12) and its inputs. During Cycle 2 of timing diagram 350, skew detect mod 308 determines functional mode of operation (that is, the time proportions between the memory active and the memory idle state) during burn-in. More specifically, sense amplifier circuitry 398 (see FIG. 12) of skew detect mod 308 determines a skew that can be corrected by having special test mode mod 306 control the internal clock FSEL and the reset signal in a manner that corrects the skew. During Cycle 3 of timing diagram 350, as with Cycle 1, skew detect mod 308 once again determines idle mode of operation during burn-in.

In idle mode, internal clock FSEL is self-timed (that is no intervention of special test mode mod 306) and has a shorter pulse width (as in conventional burn-in of memory circuits). In functional mode (see Cycle 2 of timing diagram 350), special test mode mod 306 controls FSEL to have the wider pulse width of internal clock CLK, as discussed above in connection with burn-in circuitry 100.

Figure 14:
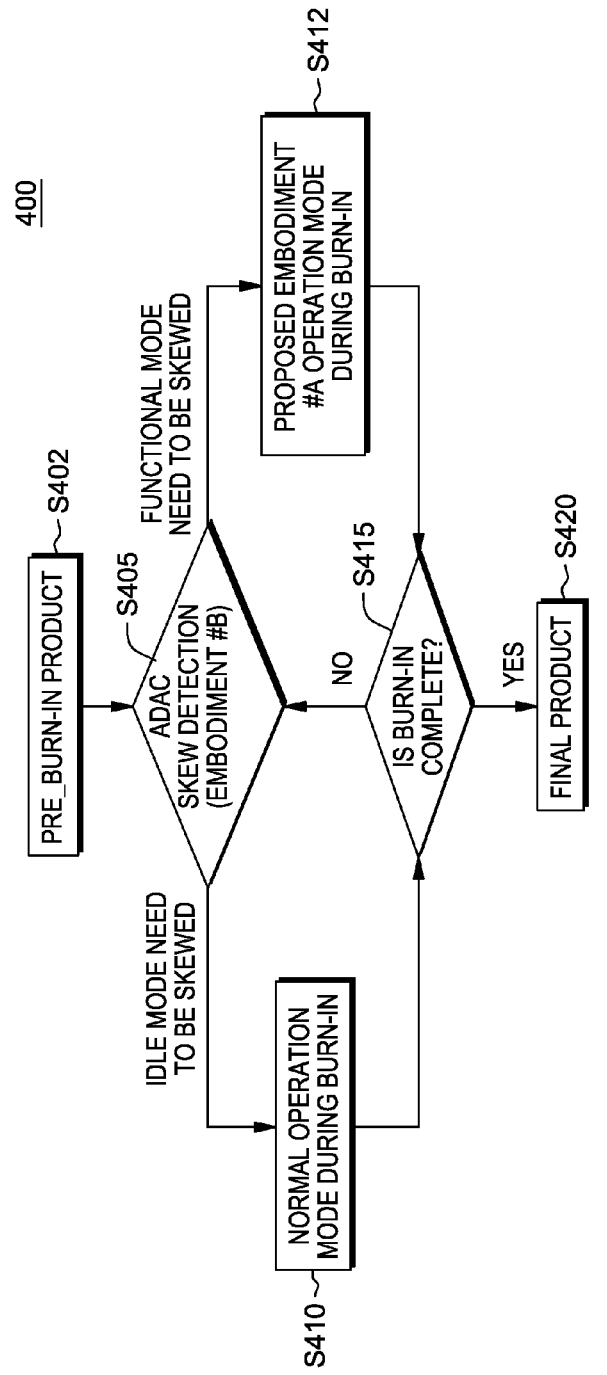
FIG. 14 is a flowchart showing a first method according to the present invention.

As shown in FIG. 14, method 400 includes the following steps (with process flow among and between the steps as shown by the arrows of FIG. 14): S402; S405; S410; S412; S415; and S420.

At step S402, pre-burn-in set of memory circuits 330 is provided. At step S405, skew detect mod 308 detects which mode (idle or functional) requires corrective skew.

If step S405 determines that idle mode requires corrective skew, then processing proceeds to step S410 which means that burn-in occurs as it would in conventional devices, without intervention of special test mode mod 306. Processing proceeds to step S415.

If step S405 determines that functional mode requires corrective skew, then processing proceeds to step S412 which means that special test mode mod 306 adjusts the internal clock FSEL (for example, adjusts the falling edge of the FSEL pulses to coincide with the falling edges of the external clock CLK pulses). Processing proceeds to step S415.

At step S415, it is determined whether burn-in has been completed. If it has not, then processing loops back to step S405. On the other hand, if it is determined that burn-in has been completed for memory circuits 330, then processing proceeds to step S420, where memory circuits 330 are removed from burn-in circuitry 300 to be installed in a memory device (see memory circuits 230 in FIG. 10) for field use.

Some embodiments of the present invention may include one, or more, of the following features, characteristics and/or advantages: (i) can be used to burn-in SRAM (static random access memory) memory circuit sets; (ii) can be used to heal SRAM (static random access memory) memory circuit sets with respect to forward/reverse path damage; (iii) asynchronous timing control both during burn-in and on-field; (iv) a group of ADAC circuits averages inherent skew that may present in the circuit; and/or (v) a circuit that can sense an input signal's duty factor based on BTI degradation and then lock in a state that can be used in different manners to correct for the BTI duty factor distortion.

Some embodiments of the present invention may include one, or more, of the following features, characteristics and/or advantages: (i) a method of stressing transistors during burn-in, so that degradation after burn-in is asymptotic and small during the lifetime of the product—thus giving a consistent and reliable performance during the life; (ii) for a self-timed memory design which depends on only the rising edge of the input clock, use of a test mode that is dependent on the duty cycle of the input clock, so the memory cycle is active during its high period and inactive during the low period; (iii) controlling the duty cycle of the input clock will allow stressing of all transistors (both transistors stressed only during active state and transistors stressed only during inactive state) approximately symmetrically without having to run the part at a higher frequency during burn-in; (iv) setting the state of a logic path during idle state of the product as a function of stress experienced during active mode, so as to balance out the stress for devices that are stressed in active and inactive states; and/or (v) use of a skew detection circuit as an input control circuitry that sets the logic state (active or idle) of the whole memory during burn-in.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device comprising:
   a set of memory circuits configured to store data by selectively being operated in one of the two following states: idle state and active state;
   a timing control module configured to selectively control the operational state of the set of memory circuits, with the timing control module including a root combinational logic location; and
   an age-detect-and-correct (ADAC) circuit, connected across the root combinational logic location and including a first set of transistor(s) and a second set of transistor(s), the ADAC circuit being configured to control the timing control module to arbitrate between the idle state and the active state based upon a difference in bias temperature instability fatigue as between the first set of transistor(s) and the second set of transistor(s).

2. The memory device of claim 1 wherein:
   the ADAC circuit further includes sense amplifier circuitry; and
   the first set of transistor(s) and second set of transistor(s) are part of the sense amplifier circuitry.

3. The memory device of claim 2 wherein:
   the first set of transistor(s) includes a first transistor pair constituted by first p-type transistor including a gate and a first n-type transistor including a gate;
   the second set of transistor(s) includes a second transistor pair constituted by a second p-type transistor including a gate and a second n-type transistor including a gate; and
   the first transistor pair and the second transistor pair are nominally matched, but exhibit operational mismatch, when in operation, due to a difference in bias temperature instability fatigue as between the first transistor pair and the second transistor pair.

4. The memory device of claim 3 wherein:
the gate of the first p-type transistor and the gate of the first n-type transistor are electrically coupled to each other; and
the gate of the second p-type transistor and the gate of the second n-type transistor are electrically coupled to each other.

5. The memory device of claim 4 wherein:
the first p-type transistor and the second n-type transistor are electrically connected in series with each other; and
the second p-type transistor and the first n-type transistor are electrically connected in series with each other.

6. The memory device of claim 3 wherein:
the first transistor pair experiences more bias temperature instability stress than the second transistor pair when the memory circuits are in the active state; and
the first transistor pair experiences less bias temperature instability stress than the second transistor pair when the memory circuits are in the idle state.

7. The memory device of claim 3 wherein the operational mismatch between the first transistor pair and the second transistor pair causes a propensity to settle in a preferred state that controls a manner in which the sense amplifier circuitry resolves when a set signal is turned on.

8. The memory device of claim 2 wherein the ADAC circuit further comprises:
a tri-state inverter configured to drive an input signal to the sense amplifier to a predetermined state, as a function of an input state existing when the set of memory circuits is accessed.

9. The memory device of claim 2 wherein the ADAC circuit further comprises:
a pulse generation circuit generates a pulse to equalize two input signals which are input to the sense amplifier.

10. The memory device of claim 1 wherein:
the timing control module includes an inverter chain; and
the root combinational logic location is located in the inverter chain.

11. A memory burn-in device comprising:
a set of memory circuits configured to store data by selectively being operated in one of the two following states: idle state and active state;
a timing control module configured to selectively control the operational state of the set of memory circuits during burn-in, with the timing control module including a root combinational logic location; and
a skew detect circuit, connected across the root combinational logic location and including a first set of transistor(s) and a second set of transistor(s), the skew detect circuit being configured to control the timing control module to arbitrate between the idle state and the active state, during burn-in, based upon a difference in bias temperature instability fatigue as between the first set of transistor(s) set and the second set of transistor(s).

12. The memory burn-in device of claim 11 wherein:
the skew detect circuit further includes sense amplifier circuitry; and
the first set of transistor(s) and second set of transistor(s) are part of the sense amplifier circuitry.

13. The memory burn-in device of claim 12 wherein:
the first set of transistor(s) includes a first transistor pair constituted by first p-type transistor including a gate and a first n-type transistor including a gate;

the second set of transistor(s) includes a second transistor pair constituted by a second p-type transistor including a gate and a second n-type transistor including a gate; and
the first transistor pair and the second transistor pair are nominally matched, but exhibit operational mismatch, when in burn-in operation, due to difference in bias temperature instability fatigue as between the first transistor pair and the second transistor pair.

14. The memory burn-in device of claim 13 wherein:
the gate of the first p-type transistor and the gate of the first n-type transistor are electrically coupled to each other; and
the gate of the second p-type transistor and the gate of the second n-type transistor are electrically coupled to each other.

15. The memory burn-in device of claim 14 wherein:
the first p-type transistor and the second n-type transistor are electrically connected in series with each other; and
the second p-type transistor and the first n-type transistor are electrically connected in series with each other.

16. The memory burn-in device of claim 13 wherein:
the first transistor pair experiences more bias temperature instability stress than the second transistor pair when the memory circuits are in the active state; and
the first transistor pair experiences less bias temperature instability stress than the second transistor pair when the memory circuits are in the idle state.

17. The memory burn-in device of claim 13 wherein the operational mismatch between the first transistor pair and the second transistor pair causes a propensity to settle in a preferred state that controls a manner in which the sense amplifier circuitry resolves when a set signal is turned on.

18. The memory burn-in device of claim 12 wherein the skew detect circuit further comprises:
a pulse generation circuit generates a pulse to equalize two input signals which are input to the sense amplifier.

19. A method comprising:
starting to perform burn-in operations using a memory burn-in device that includes a set of memory circuits and a skew detection circuit, with the memory burn-in operations including an idle state and an active state;
detecting, by the skew detection circuit, which of the following two alternatives are applicable: (i) idle state needs to be skewed, or (ii) active state needs to be skewed;
on condition that idle state needs to be skewed, then continuing burn-in operation without adjustment to an internal clock; and
on condition that active state needs to be skewed, adjusting a pulse width of an internal clock to increase the amount of time that the memory circuits are in an active state.

20. The method of claim 19 further comprising:
until burn-in operations are complete, intermittently repeating the following:
detecting, by the skew detection circuit, which of the following two alternatives are applicable: (i) idle state needs to be skewed, or (ii) active state needs to be skewed;
on condition that idle state needs to be skewed, then continuing burn-in operation without adjustment to an internal clock; and
on condition that active state needs to be skewed, adjusting a pulse width of an internal clock to increase the amount of time that the memory circuits are in an active state.

* * * * *